United States Patent [19]

Torii

[11] 4,023,108
[45] May 10, 1977

[54] ELECTRONICALLY CONTROLLABLE TUNING DEVICE HAVING A FREQUENCY SYNTHESIZER

[75] Inventor: Kenichi Torii, Yokohama, Japan

[73] Assignee: Tokyo Shibaura Electric Co., Ltd., Japan

[22] Filed: Jan. 21, 1976

[21] Appl. No.: 650,975

[30] Foreign Application Priority Data

Jan. 23, 1975 Japan ............................... 50-9324

[52] U.S. Cl. .......................... 325/464; 325/419; 325/421; 325/468; 331/1 A; 331/76

[51] Int. Cl.² .......................................... H04B 1/16

[58] Field of Search ............... 325/63, 419–423, 325/452, 453, 458, 459, 464, 467, 468–470; 331/76, 1 A, 117 R; 334/14–16

[56] References Cited

UNITED STATES PATENTS

| | | | |
|---|---|---|---|
| 3,778,716 | 12/1973 | Stokes | 325/63 |
| 3,864,636 | 2/1975 | Fukuda et al. | 325/421 |
| 3,913,020 | 10/1975 | Van Anrooy | 325/453 |

OTHER PUBLICATIONS

IEEE Spectrum on "TV Receiver Tuning Systems of the Future", by Doyle et al., vol. 15, No. 2, July 1969, pp. 220–223.

Primary Examiner—Robert L. Griffin
Assistant Examiner—Jin F. Ng
Attorney, Agent, or Firm—Finnegan, Henderson, Farabow & Garrett

[57] ABSTRACT

An electronically controllable tuning device includes a voltage controlled oscillator adapted to have an oscillation frequency controlled by a control voltage and simultaneously generate a fundamental wave of a predetermined frequency, a programmable frequency divider for dividing the fundamental wave frequency at a frequency division ratio corresponding to the control of a channel selection means and a phase locked loop adapted to compare the fundamental wave phase with the phase of the output of the programmable divider to generate a comparison output and feeding the comparison output back to the voltage controlled oscillator to control the output frequency of the voltage controlled oscillator. The tuning device further includes means for supplying as a local oscillation signal to an intermediate frequency generating mixer one of higher harmonic wave components of the fundamental wave.

8 Claims, 3 Drawing Figures

ELECTRONICALLY CONTROLLABLE TUNING DEVICE HAVING A FREQUENCY SYNTHESIZER

BACKGROUND OF THE INVENTION

This invention relates to an electronically controllable tuning device with a frequency synthesizer which controls a local oscillation frequency by a phase locked loop including a programmable frequency divider having a frequency division ratio controlled by a channel selection device.

Known is an electronically controllable tuning device with a frequency synthesizer which includes a phase locked loop having a programmable divider for frequency dividing the oscillation frequency of a local oscillator, means for varying the frequency division ratio of the programmable divider according to the frequency of a selected broadcasting electromagnetic wave and means for feeding back to the local oscillator the output of a phase detector for comparing phases of a reference frequency and the output of a programmable divider to control the oscillation frequency of the local oscillator and supplies the controlled oscillation frequency as a local oscillation signal to an intermediate frequency generating mixer. The outline of the electronically controllable tuning device with a frequency synthesizer is disclosed in a magazine "NIKKEI ELECTRONICS" pages 59 to 61, published on July 29, 1974 by NIKKEI MacGraw-Hill. Where, however, such a known electronically controllable tuning device is applied to a television tuner for use in an ultra-high frequency (UHF) band, a frequency division circuit including the above-mentioned programmable frequency divider must be operated at a high frequency of about 1 GHz. This is due to the fact that in Japan, for example, the oscillation frequency of the local oscillator in the UHF television tuner is determined to be in a range of 530 to 824 MHz. Such a frequency division circuit is difficult to manufacture and operate in a stable way and therefore unsuitable from a practical viewpoint.

It is accordingly the object of this invention to provide an electronically controllable tuning device with a frequency synthesizer which can be suitably put to practice by making a frequency treated in a phase locked loop lower than a local oscillation frequency which is supplied to a mixer.

SUMMARY OF THE INVENTION

According to this invention there is provided an electronically controllable tuning device with a synthesizer which comprises a radio frequency amplifier adapted to tune in a broadcasting electromagnetic wave to be received and amplify it; a frequency mixer for converting the output frequency of the radio frequency amplifier to an intermediate frequency; a first voltage controlled oscillator adapted to simultaneously generate a fundamental wave of a predetermined frequency and higher harmonic components of the fundamental wave and to have the frequency of the fundamental wave controlled by a control voltage; a local oscillation signal supply circuit for supplying one of the higher harmonic wave components as a local oscillation signal to the mixer; a programmable frequency divider adapted to receive from the first voltage controlled oscillator an output of lower frequency than that of the higher harmonic wave components and frequency divide it; a channel selection device for controlling the frequency division ratio of the programmable frequency divider; a reference frequency generator; a phase detector for effecting a comparison in phase between the output of the programmable frequency divider and the output of the reference frequency generator; and a low pass filter for feeding a low frequency component of the output of the phase detector back to the first voltage controlled circuit to control the output frequency of the first voltage controlled oscillator.

With respect to the fundamental wave and the higher harmonic waves thereof included in the output of an oscillator, in general, the frequency of a higher harmonic wave is an integral multiple of the frequency of the fundamental wave and the high harmonic wave has a predetermined phase relation to the fundamental wave. By bringing, in the phase locked loop, the phase of the frequency of one output of the local oscillator in synchronism with the phase of the reference frequency, the frequency and phase of the other output of the local oscillator can be maintained in a predetermined relation to the frequency and phase of the above-mentioned one output of the local oscillator. This invention is based on such a principle. According to this invention, from among the outputs of the local oscillator a harmonic wave higher in order than the fundamental wave is supplied as a local oscillation signal to the mixer and the fundamental wave or a harmonic wave lower in order than the fundamental wave is supplied to the programmable frequency divider in the phase locked loop. In order to simplify the electronically controllable tuning device of this invention, the output of the local oscillator for generating a fundamental wave and its higher harmonic waves is supplied to a tuning amplifier adapted to tune in one of the higher harmonic waves of the output of the local oscillator for amplifying the resonated higher harmonic wave and for supplying the amplified output to the mixer. It is also possible to separate through a filter a desired one of higher harmonic components of the output of the local oscillator and, after amplification, supply it to the mixer. It is also possible to provide a pull-in oscillator. In this case, a desired higher harmonic wave component of the output of the local oscillator is applied to the pull-in oscillator to generate a signal of high amplitude in synchronism with the applied higher harmonic wave component and the signal of high amplitude is coupled to the mixer. According to this method a frequency conversion efficiency in the mixer can be elevated to the full extent.

DETAILED DESCRIPTION OF THE PREFERRED EMBODIMENTS

Figure 1:
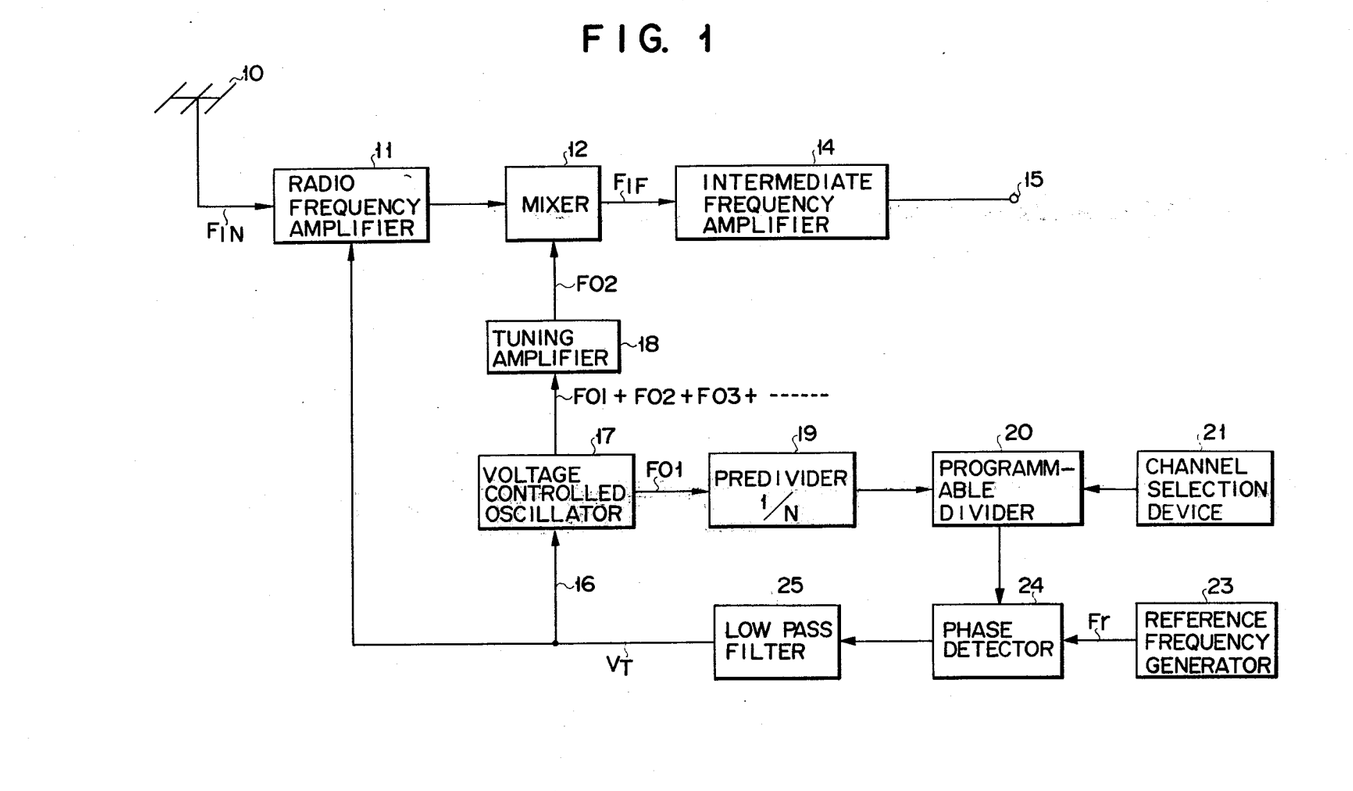
FIG. 1 is a block diagram showing an electronically controllable tuning device according to one embodiment of this invention.

FIG. 1 shows an electronically controllable tuning device for a TV receiver. A broadcasting electromagnetic wave to be received at an antenna 10 is selected and amplified at a radio frequency amplifier 11 and the output of the radio frequency amplifier is coupled to a mixer 12 where the frequency of the input broadcasting wave and the frequency of a local oscillator signal FO2 as will be later described are mixed to generate an intermediate frequency $F_{IF}$. The intermediate frequency is amplified and taken out from a terminal 15. A first voltage controlled oscillator 17 has its oscillation frequency controlled by a control voltage $V_T$ and is adapted to simultaneously generate a fundamental wave of a frequency FO1 and second, third . . . higher harmonic waves (frequencies FO2, FO3 . . . ) of the fundamental frequency. The output of the first voltage controlled oscillator is applied to a tuning amplifier 18. The tuning amplifier tunes in the second higher harmonic wave (frequency FO2) and amplifies it to a suitable amplitude level which in turn is applied as a local oscillation signal to the mixer 12. On the other hand, the fundamental wave is coupled to a predivider 19 where it is divided into a predetermined frequency division ratio 1/N. The output of the predivider 19 is coupled to a programmable frequency divider 20. A frequency division ratio 1/M of the programmable frequency divider 20 is varied by operating a channel selection device 21 such as a keyboard. A reference frequency generator 23 such as a crystal oscillator is adapted to generate a reference frequency Fr. The output of the programmable frequency divider 20 is compared in phase, at a phase detector 24, with the reference frequency Fr of the reference frequency generator 23. The output of the phase detector 24 is fed back to the first voltage controlled oscillator 17 through a low pass filter 25. The oscillation frequency output is controlled in a direction in which the output of the phase detector 24 is decreased. The output $V_T$ of the low pass filter 25 is coupled also to the radio frequency output 11, thus serving to select the broadcasting wave. The voltage controlled oscillator 17 includes a variable capacitance diode not shown and the oscillation frequency of the voltage controlled oscillator is controlled by controlling the capacitance of the variable capacitance diode by the output of the low pass filter 25. The radio frequency amplifier 11 also includes a variable capacitance diode not shown and the broadcasting wave to be received is selected in the amplifier 11 by controlling the capacitance of the variable capacitance diode by the output of the low pass filter 25. The voltage controlled oscillator 17, programmable frequency divider 20, reference frequency generator 23 and phase detector 24 basically constitute what is called a "phase locked loop" (hereinafter referred to as a PLL circuit).

The operation of the embodiment in FIG. 1 will now be explained below.

With $F_{IN}$, $F_{IF}$ and FO2, respectively, representing the frequency of the broadcasting wave from the antenna 10, the frequency (intermediate frequency) of the mixer and the frequency of the local oscillator signal, the following equation will be established among $F_{IN}$, $F_{IF}$ and FO2:

$$FO2 - F_{IN} = F_{IF} \qquad (1)$$

When, in the PLL circuit comprising a voltage controlled oscillator 17 (fundamental frequency FO1), predivider 19 (frequency division ratio 1/N), programmable frequency divider 20 (frequency division ratio 1/M), reference frequency generator 23 (reference frequency Fr), phase detector 24 and low pass filter 25, a synchronization is established between the frequency of the reference frequency generator 23 and a frequency obtained by frequency dividing the fundamental frequency FO1 of the voltage controlled oscillator 17, $$FO1/N \cdot M = Fr$$

Thus, $$FO1 = M \cdot N \cdot Fr \qquad (2)$$

Since the frequency division ratio 1/N of the predivider 19, as well as the reference frequency Fr of the reference frequency generator 23, is made constant and the frequency division ratio 1/M of the programmable frequency divider 20 is varied into a predetermined value according to a channel number to be selected (i.e. an input from the keyboard of the channel selection device 21), the oscillation frequency (i.e. the frequency FO1 of the fundamental wave) of the voltage controlled oscillator is varied according to the value M (i.e. the channel number to be selected) by the operation of the PLL circuit. In consequence the frequency FO2 of the second higher harmonic output of the fundamental wave and its phase are varied in a predetermined relation to the frequency of the fundamental wave and its phase. Although the second higher harmonic output of the frequency F02 is applied as a local oscillation output to the mixer 12, it will be sufficient if the frequency FO1 of the fundamental wave corresponding to one-half of the frequency of the second harmonic is controlled.

For example, the local oscillation frequency of a UHF broadcasting receiver in Japan is determined to be in a range of 530 to 824 MHz (a channel number is 50) and, therefore, 265 to 412 MHz can be used as a frequency to be treated in the PLL circuit used in this invention. In this frequency band, an emitter coupled logic integrated circuit can be used as the predivider 19. The voltage controlled oscillator 17 uses, for example, a transistor as an active element and can generate, together with a fundamental wave, higher harmonic wave components of the fundamental wave utilizing a distortion due to the non-linearity of an output waveform of the transistor at the time of a high amplitude operation. The local oscillation signal of the frequency FO2 permits the output of the voltage controlled oscillator 17 to be extracted through band pass filter. The local oscillation signal of the frequency FO2 also permits a frequency conversion efficiency to be sufficiently elevated at the mixer 12 by fully amplifying a second higher harmonic wave of the frequency FO2 at the tuning amplifier 18 and applying it to the mixer 12.

Figure 2:
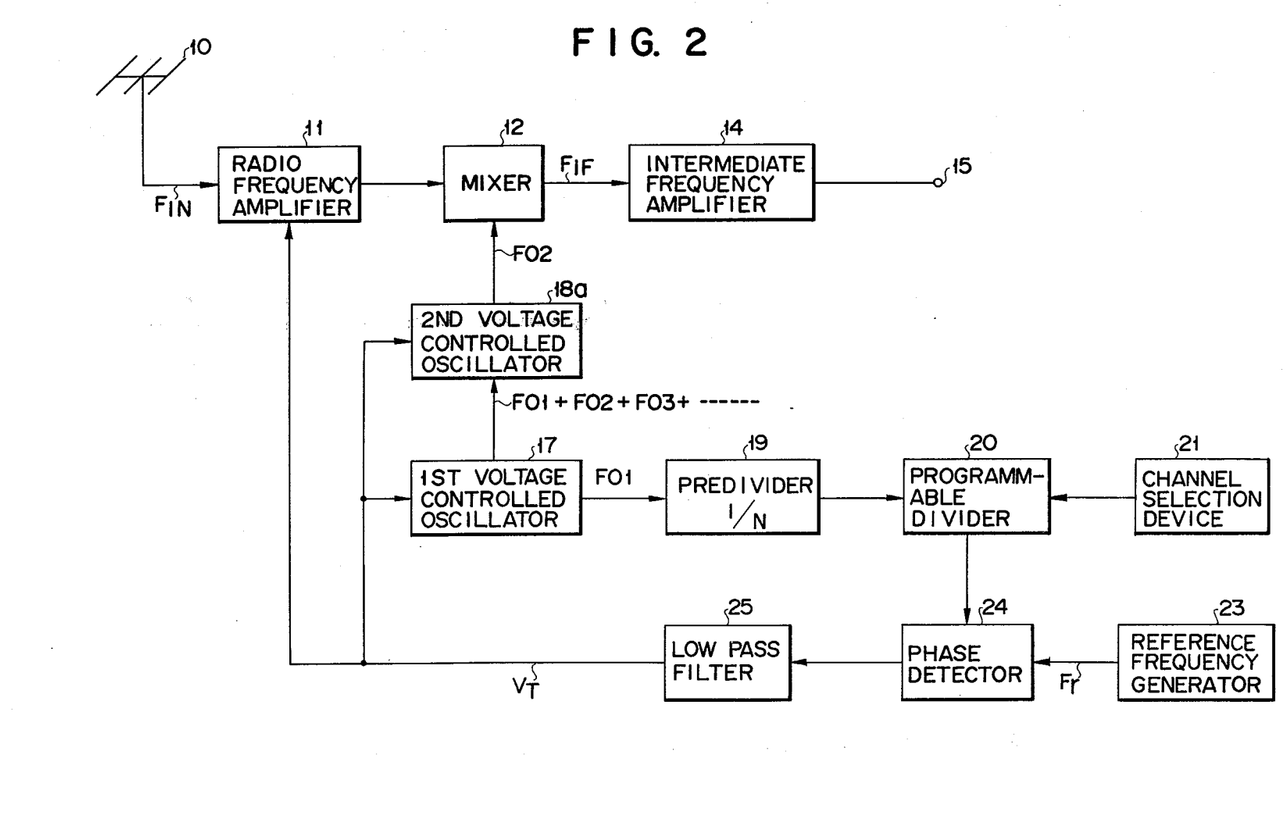
FIG. 2 is a block diagram showing an electronically controllable tuning device according to another embodiment of this invention.

Another embodiment of this invention will now be described with similar reference numerals employed to designate elements corresponding to those shown in FIG. 2. With this embodiment a second voltage controlled oscillator 18a is used in place of the tuning amplifier in FIG. 1. The second voltage controlled oscillator 18a is supplied with the output of the first voltage controlled oscillator 17 and constitutes a so-called "pull-in oscillator" adapted to oscillator in synchronism with a second higher harmonic wave of the frequency FO2 of the output of the first voltage controlled oscillator 17. The "pull-in oscillator" is also known as an injection locking oscillator.

The detailed circuit of the first and second voltage controlled oscillators most suitable to this invention will now be explained by reference to FIG. 3.

Figure 3:
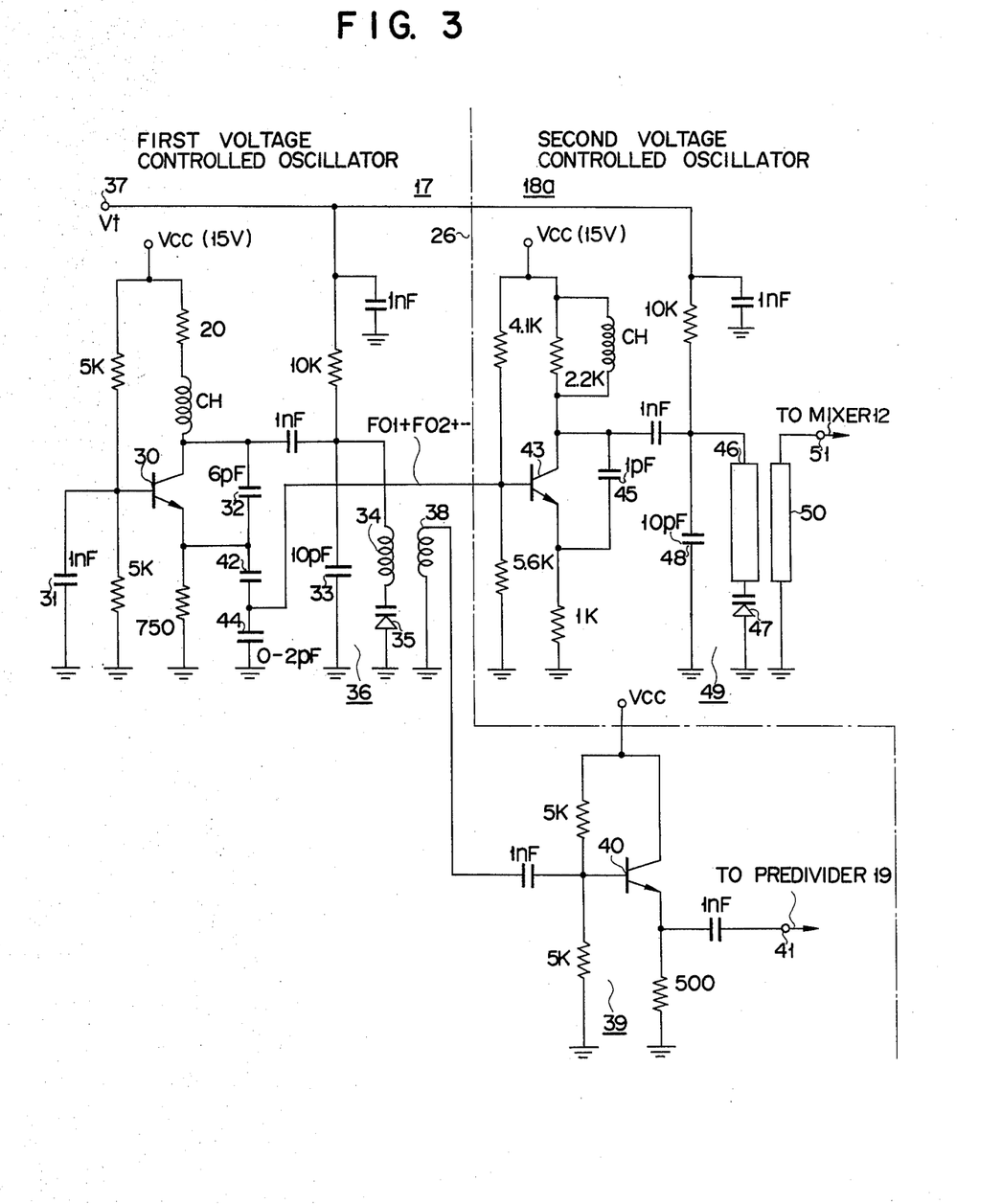
FIG. 3 is a detailed circuit diagram showing first and second voltage controlled oscillators in FIG. 2.

In FIG. 3 the first voltage controlled oscillator 17 is shown on the left side and the second voltage controlled oscillator 18a on the right side. A Colpitts oscillator in FIG. 3 includes a first transistor 30 having a capacitor 31 between the base and ground and a capacitor 32 between the emitter and the collector. Between the collector of the transistor 30 and ground is connected a parallel resonance circuit 36 consisting of a capacitor 33 and an inductor 34 and variable capacitance diode 35. The parallel resonance circuit 36 is adjusted to resonate in a range of 265 to 412 MHz. Since the capacitance of the variable capacitance diode 35 in the parallel resonance circuit 36 is varied by a control voltage $V_T$ supplied from the low pass filter 25 (FIG. 2) through a terminal 37, the oscillation frequency of the first voltage controlled oscillator 17 is controlled according to the control voltage $V_T$. That is, the first voltage controlled oscillator 17 simultaneously generates a fundamental wave of a frequency FO1 of 265 to 412 MHz and the second higher harmonic wave of the frequency FO2 according to the control voltage $V_T$. The second higher harmonic wave is in a frequency range of double the frequency of the fundamental wave i.e. in a local oscillation frequency range of 530 to 824 MHz which is necessary for broadcasting reception. The parallel resonance circuit 36 resonates to a predetermined frequency of the fundamental wave of 265 to 412 MHz. The predetermined frequency of the fundamental wave is fed to a buffer amplifier 39 through a coupling coil 38 which is coupled to an inductor 34. The buffer amplifier 39 includes a second transistor 40. The predetermined frequency FO1 of the fundamental wave which is fed to the base of the second transistor 40 is applied to the predivider 19 (FIG. 2).

The output of the first voltage controlled circuit 17 is applied from the emitter of the first transistor 30 through a coupling capacitor 42 to the base of a third transistor 43 in the second voltage controlled oscillator 18a. Another Corpitts oscillator in FIG. 3 includes the above-mentioned third transistor 43 having a capacitor 44 between the base and ground and as capacitor 45 between the collector and emitter. This oscillator generates a predetermined one of an oscillation frequency of 530 to 824 MHz (local oscillation frequency of a UHF receiver). Between the collector of the third transistor 43 and ground is connected a parallel resonance circuit 49 consisting of a series circuit of an inductor 46 of a distributed constant line and a variable capacitance diode 47 and a capacitor 48 connected in parallel with the series circuit. In consequence, the above-mentioned predetermined frequency is determined by the control voltage $V_T$ which is applied to the variable capacitance diode 47 through the terminal 37. The resonance frequency of the parallel resonance circuit 49 is adjusted, as mentioned above, to be made double the resonance frequency of the parallel resonance circuit 36 in the first voltage controlled oscillator 17. That is, the second voltage controlled oscillator 18a generates, from among 530 to 824 MHz, a predetermined frequency FO2 corresponding to the control voltage supplied from the terminal 37. The predetermined frequency output of the second voltage controlled oscillator 18a is taken out from a terminal 51 through a coupling inductor 50 and applied to the mixer 12.

The operation of the above-mentioned two oscillators will now be described in connection with FIG. 2.

The first voltage controlled oscillator 17 generates a fundamental wave of one frequency FO1 of 265 to 412 MHz and second (frequency FO2), third (frequency FO3) . . . higher harmonic waves. Of these waves the fundamental wave (frequency FO1) is fed through the buffer amplifier 39 to the predivider 19. On the other hand, the second higher harmonic wave (frequency FO2) is applied to the second voltage controlled oscillator 18a which in turn generates an oscillation output (frequency FO2) in synchronism with the second higher harmonic waves so applied. The oscillation output of the second voltage controlled oscillator 18a is fed to the mixer 12 in such a state that its amplitude is fully amplified. According to an experiment conducted, a good result was obtained with a constant of each element indicated in FIG. 3. By making the capacitance of the capacitor 44 (i.e. the base-grounded capacitance of the third transistor 43 in the second voltage controlled oscillator 18a) smaller, for example, at a value of below 2PF, the free oscillation intensity of the second voltage controlled oscillator 18a was properly weakened and the synchronization of the first and second voltage controlled oscillators 17 and 18a could be held in the stable state. Various characteristics required for a TV tuner were improved by using the second voltage controlled oscillator 18a. In particular, a power gain was made greater and a noise figure was made smaller.

In order to assure a positive operation of the programmable divider 20, in general it is preferred that a frequency to be fed to the programmable divider 20 be made lower. For this reason the predivider 19 was provided in the electronically controllable tuning device. The predivider 19 is not necessarily required in this invention. Although in each embodiment the fundamental wave is fed to the PLL circuit and the second higher harmonic wave of the fundamental wave to the mixer, it is possible to apply the fundamental wave or the second higher harmonic wave to the PLL circuit and the third higher harmonic wave to the mixer 12. If, however, the frequency division ratio of the above-mentioned PLL circuit is made smaller, a phase locking time can be shortened for rapid channel selection and, in consequence, it is preferred that the fundamental wave be fed to the PLL circuit.

What is claimed is:
1. An electronically controllable tuning device having a frequency synthesizer comprising:
 a radio frequency amplifier adapted to tune in an electromagnetic wave to be received and amplify it;
 a frequency mixer for converting an output frequency of said radio frequency amplifier to an intermediate frequency;
 a first voltage controlled oscillator adapted to simultaneously generate a fundamental wave of a predetermined frequency and higher harmonic components of the fundamental wave and to have the frequency of the fundamental wave controlled by a control voltage;
 a local oscillation signal supply circuit for supplying one of the higher wave components as a local oscillation signal to said mixer;
 a programmable frequency divider adapted to receive from said first voltage controlled oscillator an output of lower frequency than that of one of said higher harmonic components and frequency divide it;

a channel selection device for controlling the frequency division ratio of said programmable frequency divider;
a reference frequency generator;
a phase detector for effecting a comparison in phase between the output of said programmable frequency divider and the output of said reference frequency generators; and
a low pass filter adapted to feed a low frequency output component of said phase detector back to said first voltage controlled oscillator for controlling the output frequency of said first voltage controlled oscillator.

2. The electronically controllable tuning device according to claim 1, further including a predivider having a predetermined frequency division ratio between said first voltage controlled oscillator and said programmable divider.

3. The electronically controllable tuning device according to claim 1, in which said local oscillation signal supply circuit is is a second voltage controlled oscillator adapted to receive the output of said first voltage controlled oscillator as a synchronization signal, have an oscillation frequency controlled by the output of said low pass filter and supply to said mixer a local oscillation signal in synchronism with one of said higher harmonic wave components.

4. The electronically controllable tuning device according to claim 3, in which said programmable frequency divider is adapted to receive a fundamental wave of the output of said first voltage controlled oscillator.

5. The electronically controllable tuning device according to claim 1, in which said first voltage controlled oscillator comprises a first transistor oscillator including a tuning circuit having a resonance frequency controlled by the output of said low pass filter and a transistor buffer amplifier adapted to amplify the output of said first transistor oscillator and supply it to said programmable frequency divider; and said local oscillator signal supply circuit comprises a second voltage controlled oscillator including a second transistor oscillator having a tuning circuit adapted to be controlled by the output of said low pass filter to resonate to a higher harmonic wave of a predetermined frequency of the output of said first voltage controlled oscillator.

6. The electronically controllable tuning device according to claim 5, in which said first and second transistor oscillators each comprise a Colpitts oscillator including a tuning circuit connected to the collector of a transistor in the oscillator, said tuning circuit including a variable capacitance diode whose capacitance is controlled by the output of said low pass filter; and second transistor oscillator generates an output in synchronism with a second higher harmonic of the output of the first transistor oscillator.

7. The electronically controllable tuning device according to claim 1, in which said local oscillation signal supply circuit comprises a tuning amplifier adapted to tune in one of higher harmonic output waves of said first voltage controlled oscillator and supply a tuned output to said mixer.

8. The electronically controllable tuning device according to claim 7, in which said programmable frequency divider is adapted to receive a fundamental wave of the output of said first voltage controlled oscillator.

* * * * *

UNITED STATES PATENT AND TRADEMARK OFFICE
CERTIFICATE OF CORRECTION

PATENT NO. : 4,023,108            Page 1 of 3
DATED : May 10, 1977
INVENTOR(S) : Kenichi Torii It is certified that error appears in the above-identified patent and that said Letters Patent are hereby corrected as shown below:

| | | |
|---|---|---|
| ABSTRACT, | line 17, | after "of" insert --the--. |
| Column 1, | line 23, | change "and" to --which--; |
| | line 45, | change "making a frequency treated" to --treating--; |
| | line 46, | after "loop" insert --a frequency which is--; |
| | lines 46 & 47, | change "a" (both occurrences) to --the--. |
| Column 2, | line 47, | change "a" to --the--; |
| | line 48, | change "in" to --of--; |
| | line 58, | after "showing" insert --the--; |
| | line 59, | change "in" to --of--; |
| | line 64, | change "TV" to --television--; |
| | line 65, | delete "to be". |

UNITED STATES PATENT AND TRADEMARK OFFICE
CERTIFICATE OF CORRECTION

PATENT NO. : 4,023,108
DATED : May 10, 1977
INVENTOR(S) : Kenichi Torii

It is certified that error appears in the above-identified patent and that said Letters Patent are hereby corrected as shown below:

| | | |
|---|---|---|
| Column 3, | line 18, | change the period to a comma and insert --i.e., the output of predivider 19 is F01/N.--; |
| | line 31, | after "output" insert --of oscillator 17--; |
| | line 31, | change "in which" to --such that--; |
| | line 34, | change "output" to --amplifier--; |
| | lines 36 & 41, | change "not shown" to --(not shown)--; |
| | line 54, | before "frequency" insert --intermediate--; |
| | line 54, | change "(intermediate frequency)" to --output--. |
| Column 4, | line 46, | change "filter" to --filtering--; |
| | line 60, | change "oscillator" to --oscillate--; |
| | line 61, | delete "the". |

UNITED STATES PATENT AND TRADEMARK OFFICE
CERTIFICATE OF CORRECTION

PATENT NO. : 4,023,108
DATED : May 10, 1977
INVENTOR(S) : Kenichi Torii

It is certified that error appears in the above-identified patent and that said Letters Patent are hereby corrected as shown below:

| | | |
|---|---|---|
| Column 5, | line 39, | change "Corpitts" to --Colpitts--. |
| Column 6, | line 24, | change "TV" to --television--; |
| | line 26, | change "a" (both occurrences) to --the--. |
| Column 7, | line 21, | delete "is" (second occurrence); |
| | line 23, | delete the comma and insert --and to--; |
| | line 24, | change "an" to --its--; |
| | line 25, | after "and" insert --to--. |
| Column 8, | line 19, | after "and" insert --in which said-- |
| | line 26, | after "one of" insert -- the --. |

Signed and Sealed this

Twenty-seventh Day of September 1977

[SEAL]

Attest:

RUTH C. MASON
*Attesting Officer*

LUTRELLE F. PARKER
*Acting Commissioner of Patents and Trademarks*